(12) United States Patent
Jeon et al.

(10) Patent No.: US 8,247,826 B2
(45) Date of Patent: Aug. 21, 2012

(54) LIGHT EMITTING DISPLAY DEVICE

(75) Inventors: Hee-Chul Jeon, Yongin (KR); Ji-Eun Kim, Yongin (KR); Jung-I Yun, Yongin (KR); Sang-Min Hong, Yongin (KR)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 386 days.

(21) Appl. No.: 12/699,468

(22) Filed: Feb. 3, 2010

(65) Prior Publication Data

US 2011/0057208 A1 Mar. 10, 2011

(30) Foreign Application Priority Data

Sep. 9, 2009 (KR) .................. 10-2009-0085065

(51) Int. Cl.
*H01L 33/08* (2010.01)
(52) U.S. Cl. ........................................ 257/88
(58) Field of Classification Search .............. 257/66, 257/72, E21.7, E29.003, E29.259, 223, 227, 257/291, 292, 439, 443, 665, E27.1, E27.125, 257/E27.112, E29.117, E29.145, E29.147, 257/E29.151, E29.182, E29.202, E29.273–E29.299, 257/E29.314, E29.32, E23.016, 40, 642–643, 257/759, E21.503, E51.001–E51.052, 252–254, 257/257–258, 13, 79–103, 918, E33.001–E33.077, 257/E25.028, E25.032, E27.117–E27.119; 438/29, 69, 82, 99, 28, 163, 149
See application file for complete search history.

(56) References Cited

U.S. PATENT DOCUMENTS 7,053,548 B2 * 5/2006 Nakanishi ............... 313/506

| 2002/0187255 A1 | 12/2002 | Yi et al. |
| 2004/0004434 A1 | 1/2004 | Nishi et al. |
| 2005/0139841 A1 * | 6/2005 | Park .................. 257/79 |
| 2008/0017866 A1 | 1/2008 | Sato |

(Continued)

FOREIGN PATENT DOCUMENTS

JP 2003007463 1/2003

(Continued)

OTHER PUBLICATIONS

The Registration Determination Certificate issued by Korean Intellectual Property Office on Sep. 28, 2011, corresponding to KR 10-2009-0085065 and Request for Entry attached herewith.

(Continued)

*Primary Examiner* — Dao H Nguyen
*Assistant Examiner* — Tram H Nguyen
(74) *Attorney, Agent, or Firm* — Robert E. Bushnell, Esq.

(57) ABSTRACT

Provided is an organic light emitting display device sealed maintaining durability by preventing permeation of oxygen and moisture and improving impact resistance. The light emitting display device includes a first substrate; a second substrate disposed facing toward the first substrate; an emission unit disposed between the first substrate and the second substrate and comprising a plurality of light emitting devices; a first sealant disposed between the first substrate and the second substrate, and surrounding the emission unit and combining the first substrate and the second substrate; a first region formed between around a flat portion of the first sealant and a margin of the second substrate; a second region formed between around a corner of the first sealant and a margin of the second substrate; a second sealant disposed in the first region; and a third sealant disposed in the second region.

12 Claims, 3 Drawing Sheets

U.S. PATENT DOCUMENTS

2009/0009865 A1  1/2009  Nishida et al.
2012/0032178 A1* 2/2012  Imai et al. .................. 257/59
2012/0068169 A1* 3/2012  Hirase et al. ................ 257/40

FOREIGN PATENT DOCUMENTS

| | | |
|---|---|---|
| JP | 2006252885 | 9/2006 |
| KR | 10-2004-0081163 A | 9/2004 |
| KR | 10-2008-0021650 A | 3/2008 |
| WO | 03065470 A1 | 8/2003 |
| WO | 2006135474 A1 | 12/2006 |

OTHER PUBLICATIONS

Korean Office Action issued by KIPO, dated Feb. 9, 2011, corresponding to Korean Patent Application No. 10-2009-0085065, together with Request for Entry.

* cited by examiner

LIGHT EMITTING DISPLAY DEVICE

CLAIM OF PRIORITY

This application makes reference to, incorporates the same herein, and claims all benefits accruing under 35 U.S.C.§119 from an application earlier filed in the Korean Intellectual Property Office on 9 Sep. 2009 and there duly assigned Serial No. 10-2009-0085065.

BACKGROUND OF THE INVENTION

1. Field of the Invention

The present invention relates to an organic light emitting display device, and more particularly, to an organic light emitting display device sealed by using an inorganic sealant.

2. Description of the Related Art

Organic light emitting display devices have a wide viewing angle, a high contrast ratio, a short response time, and low power consumption, therefore, the organic light emitting display devices have been applied to various fields including personal portable electronic devices, such as MP3 players and cellular phones, and televisions.

SUMMARY OF THE INVENTION

It is therefore an object for the present invention to provide an improved organic light emitting display device which has an improved durability by preventing permeation of oxygen and moisture from the display device and improving impact resistance.

In accordance with an aspect of the present invention, there is provided a light emitting display device including a first substrate; a second substrate disposed facing toward the first substrate; an emission unit disposed between the first substrate and the second substrate, and the emission unit including a plurality of light emitting devices; a first sealant disposed between the first substrate and the second substrate, and surrounding the emission unit and combining the first substrate and the second substrate; a first region formed between a flat portion of the first sealant and an outer edge of the second substrate; a second region formed between a corner of the first sealant and the outer edge of the second substrate; a second sealant disposed in the first region; and a third sealant disposed in the second region.

The first sealant may include an inorganic material, and the inorganic material may include glass frit.

The second sealant or the third sealant may contact the first substrate and the second substrate.

The second sealant or the third sealant may include an organic material.

The second sealant or the third sealant may contact the first sealant.

The second sealant and the third sealant may be connected to each other.

At least one insulating layer may be interposed between the first, second, and third sealant and the first substrate or the second substrate.

In accordance with another aspect of the present invention, there is provided a light emitting display device including: a first substrate; a second substrate disposed facing toward the first substrate; an emission unit disposed between the first substrate and the second substrate, and the emission unit including a plurality of light emitting devices; a first sealant disposed between the first substrate and the second substrate and surrounding the emission unit, combining the first substrate and the second substrate, and formed of an inorganic material; a second sealant disposed around the first sealant and between the first substrate and the second substrate, combining the first substrate and the second substrate, formed of an organic material, and having a first width; and a third sealant disposed around the first sealant and between the first substrate and the second substrate, combining the first substrate and the second substrate, formed of an organic material, and having a second width that is different from the first width.

The third sealant may be disposed to correspond to a corner of the second substrate.

The second sealant and the third sealant may contact the first sealant.

At least one insulating layer may be interposed between the first, second, and third sealant and the first substrate or the second substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
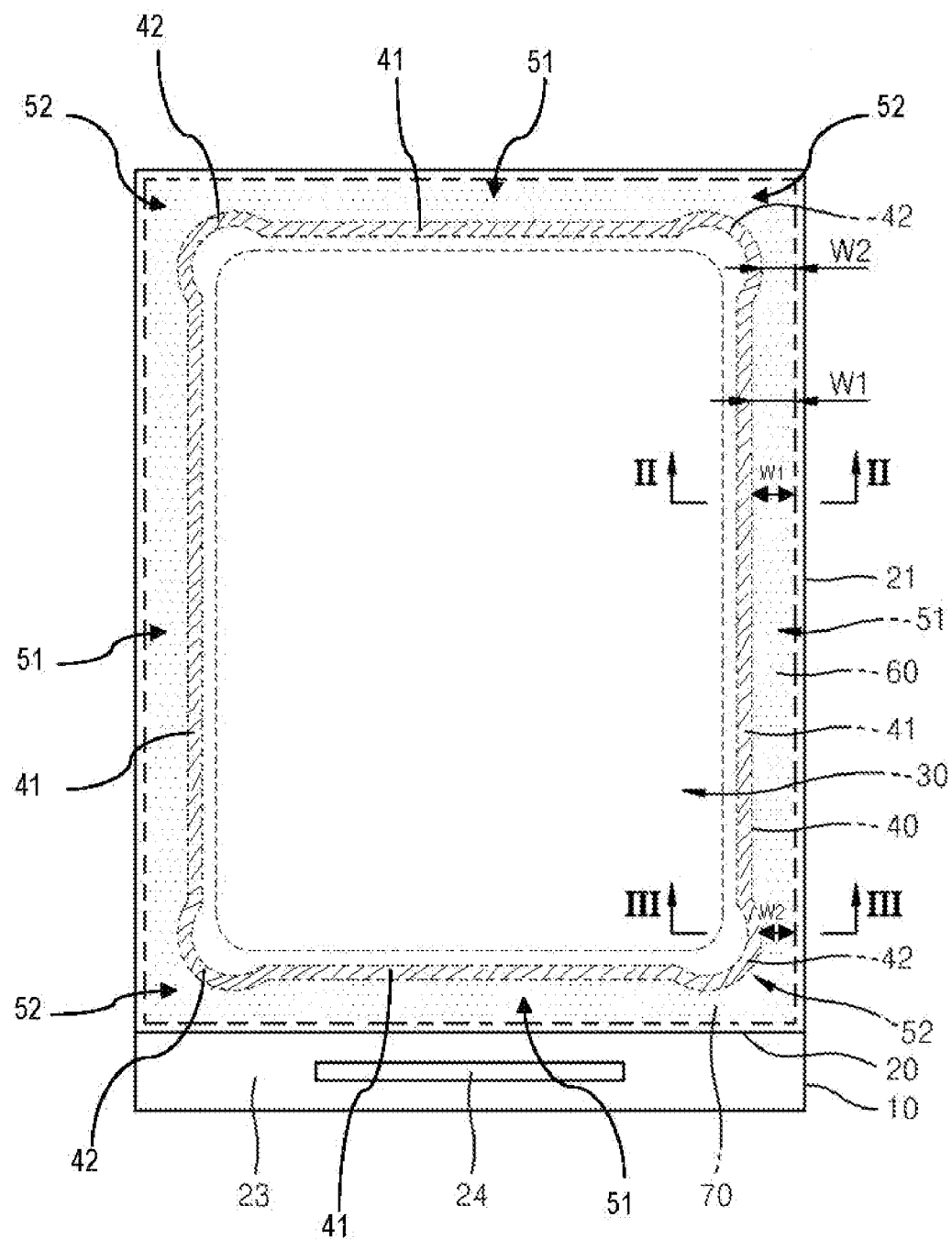
FIG. 1 is a plan view of an organic light emitting display device constructed as an embodiment of the present invention.

Hereinafter, the present invention will now be described more fully with reference to the accompanying drawings, in which exemplary embodiments of the invention are shown.

Here, when one element is referred to as being connected to another element, one element may not only be directly connected to another element but instead may be indirectly connected to another element via one or more other elements. Also, when an element is referred to as being "on" another element, it can be directly on another element or be indirectly on another element with one or more intervening elements interposed therebetween. Further, some of the elements that are not essential to the complete description of the invention have been omitted for clarity. In addition, like reference numerals refer to like elements throughout.

Organic light emitting display devices may degrade due to oxygen and moisture. Therefore, there is a need for a sealing structure which may prevent permeation of oxygen and moisture.

Since thickness of the organic light emitting display devices decreases over time, impact resistance of the organic light emitting display devices may be decreased. Therefore, there is a need to improve the impact resistance of the organic light emitting display devices.

Figure 2:
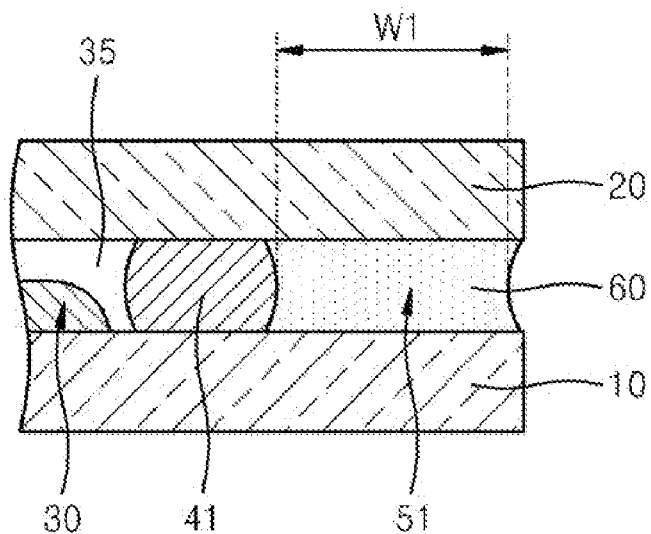
FIG. 2 is a cross-sectional view of the organic light emitting display device taken along line II-II of FIG. 1.
Figure 3:
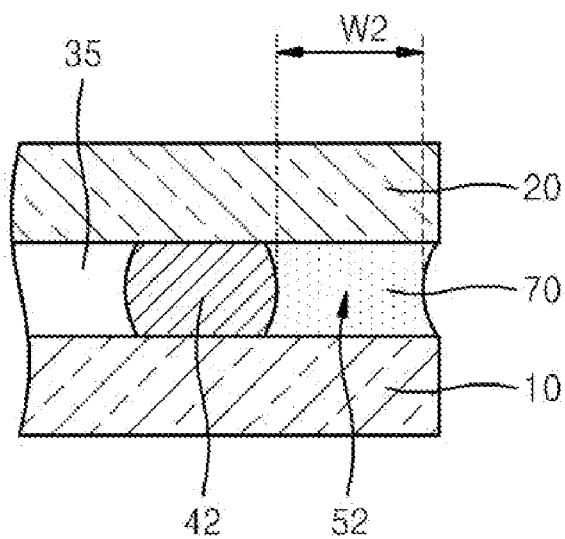
FIG. 3 is a cross sectional view of the organic light emitting display device taken along line III-III of FIG. 1.

FIG. 1 is a plan view of an organic light emitting display device constructed as an embodiment of the present invention. FIG. 2 is a cross-sectional view of the organic light emitting display device taken along line II-II of FIG. 1. FIG. 3 is a cross sectional view of the organic light emitting display device taken along line of FIG. 1.

Referring to FIGS. 1 through 3, the organic light emitting display device constructed as the present embodiment includes a first substrate 10 and a second substrate 20 facing the first substrate 10, and an emission unit 30 disposed between the first substrate 10 and the second substrate 20. In accordance with the current embodiment, emission unit 30 may be formed on the first substrate 10 facing toward the second substrate 20, but is not limited thereto. Emission unit 30 may instead be formed on the second substrate 20 facing toward the first substrate 10.

The first substrate 10 and/or the second substrate 20 may be a glass substrate, but are not limited thereto. The first substrate 10 and/or the second substrate 20 may also be a metal or plastic substrate.

Meanwhile, the second substrate 20 may be smaller than the first substrate 10. Accordingly, a portion of the first substrate 10 is exposed. A pad unit 23 and an integrated circuit (IC) 24 may be disposed on the exposed portion of the first substrate 10.

The first substrate 10 is combined with the second substrate 20 by a first sealant 40 disposed between the first substrate 10 and the second substrate 20.

As illustrated in FIG. 1, the first sealant 40 has a rectangular closed loop structure so as to surround the emission unit 30, wherein each corner of the closed loop protrudes. That is, the first sealant 40 may have flat and straight first portions 41 and protruding and curved second portions 42 at the corners. The first sealant 40 may have flat and straight first portions 41 disposed on four sides of the rectangular closed loop and protruding and curved second portions 42 disposed at four corners of the rectangular closed loop.

Due to the shape of the first sealant 40, regions between the first sealant 40 and an outer edge of the second substrate 20 includes two different kinds of regions, i.e., first regions 51 and second regions 52. That is, the first regions 51 may be disposed between the first portions 41 of the first sealant 40 and the outer edge of the second substrate 20, and the second regions 52 may be disposed between the second portions 42 of the first sealant 40 and the outer edge of the second substrate 20.

A space disposed between the first substrate 10 and the second substrate 20 may be sealed by the first sealant 40, and emission unit 30 may be disposed within the space sealed by the first sealant 40. Meanwhile, referring to FIG. 2, a filler 35 may be filled in the space sealed by the first sealant 40.

Filler 35 may cover emission unit 30 in the space sealed by the first sealant 40. In this regard, filler 35 may contact the first sealant 40, the second substrate 20, the first substrate 10, and emission unit 30. The filler 35 may be a colorless solid or liquid material having a transmittance of 95% or greater and a thickness of about 30 μm or less. For example, the solid material may be epoxy, urethane acrylate, epoxy acrylate, or silicon (such as bisphenol A type epoxy, cycloaliphatic epoxy resin, phenyl silicon resin or rubber, acrylic epoxy resin, or aliphatic urethane acrylate). The solid material may be formed by filling a liquid into the space sealed by the first sealant 40, and then hardening the liquid using heat, electron beam or UV rays. Alternatively, the solid material may be formed with a patterned film. In addition, the liquid material may be silicon or silicon oil having a volume change of about 5% or less without having phase change between temperatures ranging from about −40° C.☐ to about 100° C. ☐. Such material may be selected among a group consisting of hexamethyldisiloxane, octamethyltrisiloxane, decamethyltetrasiloxane, dodecamethylpentasiloxane, and polydimethylsiloxanes. The space disposed between the first substrate 10 and the second substrate 20 sealed by using the first sealant 40 may be filled not only with the filler 35, but also with an inert gas or air which forms an air-gap.

Meanwhile, the first sealant 40 may be formed of an inorganic material so as to inhibit permeation of external gas. The inorganic material may be glass frit. In this case, the glass frit may transmit or reflect laser beams or infrared rays, or may include a material absorbing a wavelength of a laser beam, such as iron (Fe), copper (Cu), vanadium (V), or neodymium (Nd). In addition, the glass frit may further include a filler material for harmonizing the thermal expansion coefficients of the first substrate 10 and the second substrate 20. The glass frit may be other various known glass frit.

During the formation of the first sealant 40 including such an inorganic material, excess stress may be applied to the first sealant 40 between the first substrate 10 and/or the second substrate 20, and thus the sealing strength thereof may be reduced.

When at least one insulating layer is formed on the first substrate 10 and/or the second substrate 20, and the first sealant 40 is formed on the insulating layer, as will be described later, the insulating layer may easily exfoliate.

In order to overcome the above problems, a second sealant 60 and a third sealant 70 are formed around the first sealant 40.

The second sealant 60 is formed in the first regions 51 between the first portions 41 of the first sealant 40 and the outer edge of the second substrate 20. In addition, the third sealant 70 is formed in the second regions 52 between the second portions 42 of the first sealant 40 and the outer edge of the second substrate 20.

Referring to FIGS. 1 through 3, the second sealant 60 may have uniform straight portions with a first width W1. The second sealant 60 may have straight edges and a uniformed width W1. In addition, the third sealant 70 is formed between the second portions 42 of the first sealant 40 and the outer edge of the second substrate 20. The third sealant 70 may have a second width W2 between the protruding second portions 42 of the first sealant 40 and the outer edge of the second substrate 20. The second width W2 is smaller than the first width W1. Thus, the first portions 41 have an inwardly protruding structure from the second portions 42 with respect to emission unit 30. Accordingly, the first regions 51 have a larger width than a width between a maximum protrusion of the second portions 42 and the outer edge of the second substrate 20. In other words, the uniform width of the first region 51 is larger than the minimum distance measured between the second portion 42 and the outer edge of the second substrate 20. Since the second sealant 60 is formed in the wider first regions 51, the first width W1 of the second sealant 60 is greater than the second width W2 of the third sealant 70 as shown in FIG. 3. The second width W2 of the third sealant 70 may refer to the minimum thickness of the third sealant 70. The second width W2 of the third sealant 70 may refer to the minimum distance measured between the second portion 42 and the outer periphery of the third sealant 70.

The second sealant 60 and the third sealant 70 may be formed of organic materials and connected to each other. The organic material may include at least one material selected from the group consisting of epoxy, epoxy acrylate, and silicon (such as bisphenol A type epoxy, cycloaliphatic epoxy resin, phenyl silicon resin or rubber, or acrylic epoxy resin).

The adhesive strength between the first substrate 10 and the second substrate 20 may further be increased by the second sealant 60 and the third sealant 70.

Figure 4:
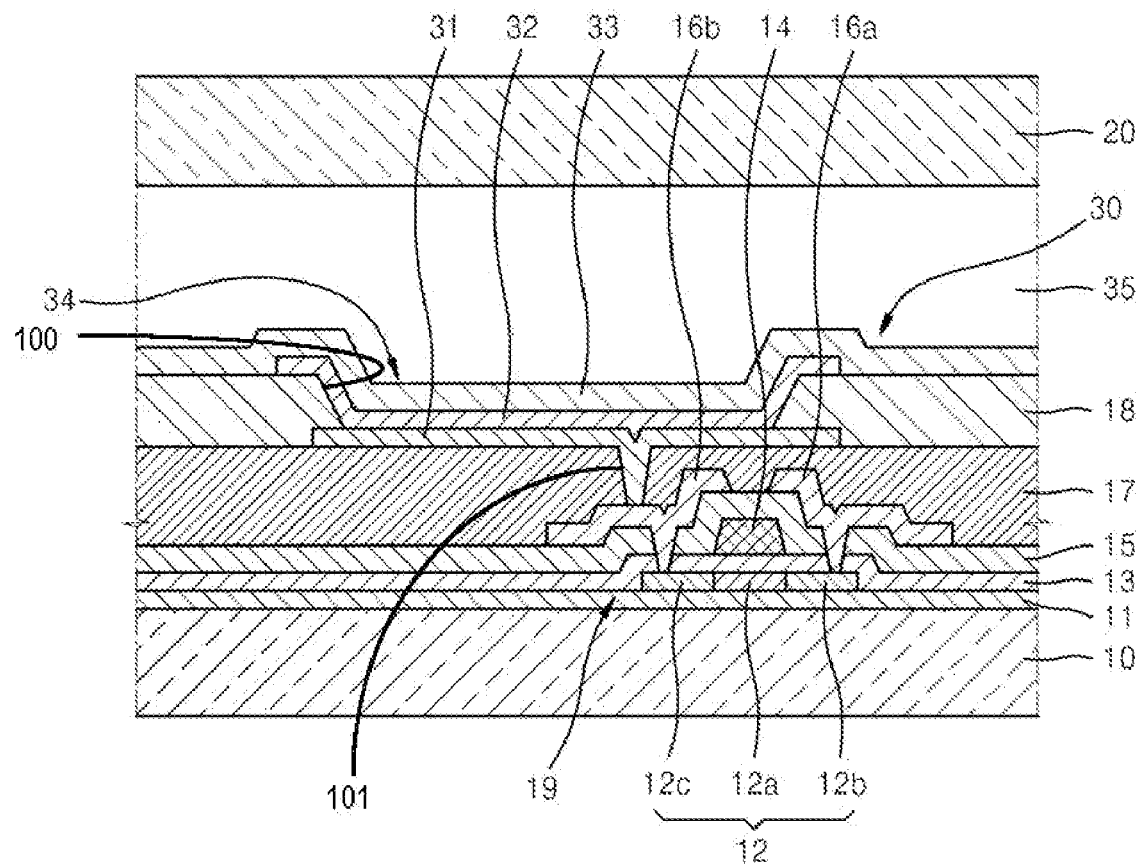
FIG. 4 is a cross-sectional view of an emission unit of FIG. 1, and more specifically, of an organic light emitting unit that is actively driven.

Meanwhile, as shown in FIG. 4, emission unit 30 is formed on the first substrate 10 and includes a plurality of organic light emitting devices (OLEDs) 34. FIG. 4 is a cross-sectional view of an emission unit 30 of FIG. 1, and more specifically, to an organic light emitting unit that is actively driven.

Referring to FIG. 4, an insulating layer 11 that may be a barrier layer for planarizing a surface of the resultant structure and preventing diffusion of impurity ions and permeation of moisture and external gas, and/or a buffer layer may be formed on the first substrate 10.

An activation layer 12 of a thin film transistor (TFT) 19 is formed of a semiconductor material and may be disposed on insulating layer 11, and a gate insulating layer 13 may cover activation layer 12. Activation layer 12 may be formed of an inorganic semiconductor such as an amorphous silicon or poly silicon, or formed of an organic semiconductor. Activation layer 12 includes a source region 12a, a drain region 12b, and a channel region 12c formed between source region 12a and drain region 12b.

A gate electrode 14 is disposed on gate insulating layer 13, and an interlayer insulating layer 15 may cover the gate electrode 14. A source electrode 16a and a drain electrode 16b are disposed on interlayer insulating layer 15, and a planarization layer 17 and a pixel defining layer 18 are sequentially formed on the resultant structure.

Gate insulating layer 13, interlayer insulating layer 15, planarization layer 17, and pixel defining layer 18 may be formed of insulating materials. Each of gate insulating layer 13, interlayer insulating layer 15, planarization layer 17, and pixel defining layer 18 may be formed as a single layer or may include multiple layers, and may be formed of an organic material, an inorganic material, or organic/inorganic composite.

The stack structure of TFT 19 is not limited to the structure described above, and TFT 19 may have other structures.

Meanwhile, a pixel electrode 31 as an electrode of the OLEDs 34 may be disposed on planarization layer 17 and pixel defining layer 18 may be disposed on the pixel electrode 31. Pixel defining layer 18 may have an opening 100 exposing pixel electrode 31, and then an organic emission layer 32 of the OLEDs 34 may be formed on pixel electrode 31.

OLEDs 34 may emit red, green, or blue light in accordance with electrical current to display predetermined image information. OLEDs 34 include pixel electrode 31 contacting drain electrode 16b of TFT 19 through a contact hole 101, an opposite electrode 33 covering all pixels, and organic emission layer 32 disposed between pixel electrode 31 and opposite electrode 33. Organic emission layer 32 emits light.

Pixel electrode 31 is electrically insulated from opposite electrode 33 by organic emission layer 32. Pixel electrode 31 and opposite electrode 33 apply voltages having different polarities to organic emission layer 32 so that organic emission layer 32 emits light.

Organic emission layer 32 may be a low molecular weight or high molecular weight organic layer. When organic emission layer 32 is a low molecular weight organic layer, organic emission layer 32 may include a hole injection layer (HIL), a hole transport layer (HTL), an emission layer (EML), an electron transport layer (ETL), and an electron injection layer (EIL), wherein each layer may be a single layer or have multiple layers. Examples of available low molecular weight organic materials include copper phthalocyanine (CuPc), N,N'-dinaphthalene-1-yl-N,N'-diphenyl-benzidine (NPB), and tris-8-hydroxyquinoline aluminum (Alq3). The low molecular weight organic layer may be formed by vacuum deposition. In this regard, the HIL, the HTL, the ETL, and the EIL are common layers with respect to red, green, and blue pixels. Accordingly, unlike the structure illustrated in FIG. 4, these common layers, similar to opposite electrode 33, may cover all of the pixels.

Pixel electrode 31 may function as an anode and opposite electrode 33 may function as a cathode. Alternatively, pixel electrode 31 may function as a cathode and opposite electrode 33 may function as an anode.

In the case of a bottom emission type organic light emitting display device in which an image is formed at the side of the first substrate 10, pixel electrode 31 may be a transparent electrode and opposite electrode 33 may be a reflective electrode. Pixel electrode 31 may be formed of a material having a high work function, such as ITO, IZO, ZnO, or $In_2O_3$, and opposite electrode 33 may be formed of metal having a low work function, such as Ag, Mg, Al, Pt, Pd, Au, Ni, Nd, Ir, Cr, Li, or Ca.

In the case of a top emission type organic light emitting display device in which an image is formed at the side of the opposite electrode 33, the pixel electrode 31 may be a reflective electrode and the opposite electrode 33 may be a transparent electrode. Pixel electrode 31, as a reflective electrode, may include a reflective layer formed of metal, such as Ag, Mg, Al, Pt, Pd, Au, Ni, Nd, Ir, Cr, Li, Ca or a mixture thereof; and a material having a high work function, such as ITO, IZO, ZnO, or $In_2O_3$. Opposite electrode 33, as a transparent electrode, may be formed by depositing metal having a low work function, such as Ag, Mg, Al, Pt, Pd, Au, Ni, Nd, Ir, Cr, Li, Ca or a mixture thereof, and depositing a transparent conductive material, such as ITO, IZO, ZnO, or $In_2O_3$, thereon to form an assistance electrode layer or a bus electrode line.

In the case of a both direction emission type organic light emitting display device, pixel electrode 31 and opposite electrode 33 may be common transparent electrodes.

Pixel electrode 31 and opposite electrode 33 may also be formed of other materials. Thus, pixel electrode 31 and opposite electrode 33 may be formed of a conductive organic material or a conductive paste containing conductive particles, for example, Ag, Mg, or Cu. The conductive paste may be applied using an inkjet printing method and then a sintering process may be performed on the conductive paste to form an electrode.

A passivation layer (not shown) may be further disposed on opposite electrode 33 and may cover emission unit 30. The passivation layer may be formed of an inorganic material, an organic material, or an organic/inorganic composite. Referring to FIG. 4, filler 35 is filled in the space disposed between opposite electrode 33 and the second substrate 20.

Figure 5:
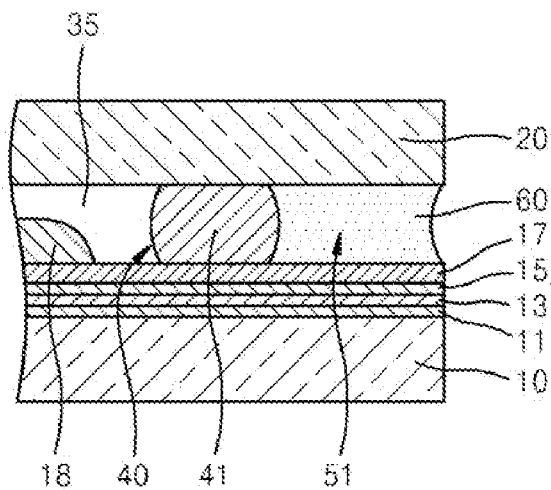
FIG. 5 is a cross sectional view of an organic light emitting display device constructed as another embodiment of the present invention, corresponding to the cross-sectional view taken along the line II-II of FIG. 1.

As described above, insulating layers formed on the first substrate 10, for example, insulating layer 11, gate insulating layer 13, interlayer insulating layer 15, and planarization layer 17, may extend to the outer edge of the first substrate 10 as shown in FIG. 5. Referring to FIG. 5, pixel defining layer 18 does not extend to the outer edge of the first substrate 10, but is not limited thereto. Pixel defining layer 18 may also extend to the outer edge of the first substrate 10.

If the insulating layers are formed on the first substrate 10, the first sealant 40 may be formed on the insulating layers. In this regard, if the first sealant 40 is formed of an inorganic material, exfoliation may occur between the insulating layers, between the first sealant 40 and the insulating layers, or between the insulating layer and the first substrate 10. Exfoliation may be prevented and adhesive strength may be improved by disposing the second sealant 60 and the third sealant 70 around the first sealant 40.

According to the present invention, an organic light emitting display device may have excellent durability by preventing permeation of oxygen and moisture and improving impact resistance.

The organic light emitting display device may also have excellent adhesive strength between a first substrate and a second substrate using a second sealant and a third sealant.

Since corners of the first sealant protrude and flat portions of the first sealant are retracted from the corners, space between the flat portion of the first sealant and the outer edge of the substrate increases. Thus, the second sealant may be formed in the space between the flat portion of the first sealant and the outer edge of the substrate to improve adhesive strength.

If insulating layers are disposed on the first substrate and/or below the second substrate, exfoliation between the first substrate and the insulating layer, between the second substrate and the insulating layer, and between the insulating layer and the first sealant may be prevented by disposing the second sealant 60 and the third sealant 70 around the first sealant 40.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A light emitting display device, comprising:
   a first substrate;
   a second substrate disposed facing toward the first substrate;
   an emission unit disposed between the first substrate and the second substrate, and the emission unit comprising a plurality of light emitting devices;
   a first sealant disposed between the first substrate and the second substrate, and the first sealant surrounding the emission unit and combining the first substrate and the second substrate;
   a first region formed between a flat portion of the first sealant and an outer edge of the second substrate;
   a second region formed between a corner of the first sealant and the outer edge of the second substrate;
   a second sealant disposed in the first region; and
   a third sealant disposed in the second region.

2. The light emitting display device of claim 1, wherein the first sealant comprises an inorganic material.

3. The light emitting display device of claim 2, wherein the inorganic material comprises glass frit.

4. The light emitting display device of claim 1, wherein one of the second sealant or the third sealant contacts the first substrate and the second substrate.

5. The light emitting display device of claim 1, wherein one of the second sealant or the third sealant comprises an organic material.

6. The light emitting display device of claim 1, wherein one of the second sealant or the third sealant contacts the first sealant.

7. The light emitting display device of claim 1, wherein the second sealant and the third sealant are connected to each other.

8. The light emitting display device of claim 1, wherein at least one insulating layer is interposed between the first, second, and third sealants and one of the first substrate and the second substrate.

9. A light emitting display device, comprising:
   a first substrate;
   a second substrate disposed facing toward the first substrate;
   an emission unit disposed between the first substrate and the second substrate, and the emission unit comprising a plurality of light emitting devices;
   a first sealant disposed between the first substrate and the second substrate, the first sealant surrounding the emission unit, and the first sealant combining the first substrate and the second substrate, with the first sealant being formed of an inorganic material;
   a second sealant disposed around the first sealant and between the first substrate and the second substrate, combining the first substrate and the second substrate, being formed of an organic material, and having a first width; and
   a third sealant disposed around the first sealant and between the first substrate and the second substrate, combining the first substrate and the second substrate, being formed of an organic material, and having a second width which is different from the first width.

10. The light emitting display device of claim 9, wherein the third sealant is disposed to correspond to a corner of the second substrate.

11. The light emitting display device of claim 9, wherein the second sealant and the third sealant contact the first sealant.

12. The light emitting display device of claim 9, wherein at least one insulating layer is interposed between the first, second, and third sealant and the first substrate or the second substrate.

* * * * *